United States Patent
Gatard et al.

(10) Patent No.: US 10,447,159 B2
(45) Date of Patent: Oct. 15, 2019

(54) DC-DC CONVERTER BLOCK, DC-DC CONVERTER COMPRISING SAME AND ASSOCIATED SYSTEM ENVELOPE TRACKING SYSTEM

(71) Applicant: WUPATEC, Limoges (FR)

(72) Inventors: Emmanuel Gatard, Panazol (FR); Pierre Lachaud, Saint Just le Martel (FR)

(73) Assignee: WUPATEC, Limoges (FR)

( * ) Notice: Subject to any disclaimer, the term of this patent is extended or adjusted under 35 U.S.C. 154(b) by 0 days.

(21) Appl. No.: 15/577,779

(22) PCT Filed: May 26, 2016

(86) PCT No.: PCT/FR2016/051240
§ 371 (c)(1),
(2) Date: Nov. 29, 2017

(87) PCT Pub. No.: WO2016/193578
PCT Pub. Date: Dec. 8, 2016

(65) Prior Publication Data
US 2018/0131277 A1 May 10, 2018

(30) Foreign Application Priority Data
May 29, 2015 (FR) ..................... 15 54917

(51) Int. Cl.
*H03F 1/30* (2006.01)
*H02M 3/158* (2006.01)
(Continued)

(52) U.S. Cl.
CPC ............. *H02M 3/158* (2013.01); *H02M 1/08* (2013.01); *H02M 3/1588* (2013.01);
(Continued)

(58) Field of Classification Search
CPC ..................................... H03F 1/30; H03F 1/22
(Continued)

(56) References Cited

U.S. PATENT DOCUMENTS

| | | | |
|---|---|---|---|
| 6,724,257 B2 * | 4/2004 | Wrathall | H02M 3/156 330/253 |
| 7,737,789 B2 * | 6/2010 | Eisenstadt | H03F 3/265 330/310 |

(Continued)

FOREIGN PATENT DOCUMENTS

| | | |
|---|---|---|
| EP | 1 597 821 B1 | 11/2005 |
| EP | 1 606 681 A2 | 12/2005 |

(Continued)

OTHER PUBLICATIONS

SG Written Opinion for Application No. 11201709394V, dated Aug. 6, 2018.

(Continued)

*Primary Examiner* — Henry Choe
(74) *Attorney, Agent, or Firm* — Young & Thompson

(57) ABSTRACT

Disclosed is a high-power and high-frequency DC-DC converter block for the envelope tracking technique including a step-down power circuit whose output constitutes the output of the DC-DC converter block, the step-down power circuit including at least one HEMT depletion-mode transistor, the DC-DC converter block further including a gate driving circuit of the at least one HEMT depletion-mode transistor of the step-down power circuit. The driving circuit has HEMT depletion-mode transistors configured to drive the gate of the at least one HEMT depletion-mode transistor of the step-down power circuit, and the step-down power circuit is powered by two positive and non-zero power supply voltages, namely a first power supply voltage and a (Continued)

Figure 1:
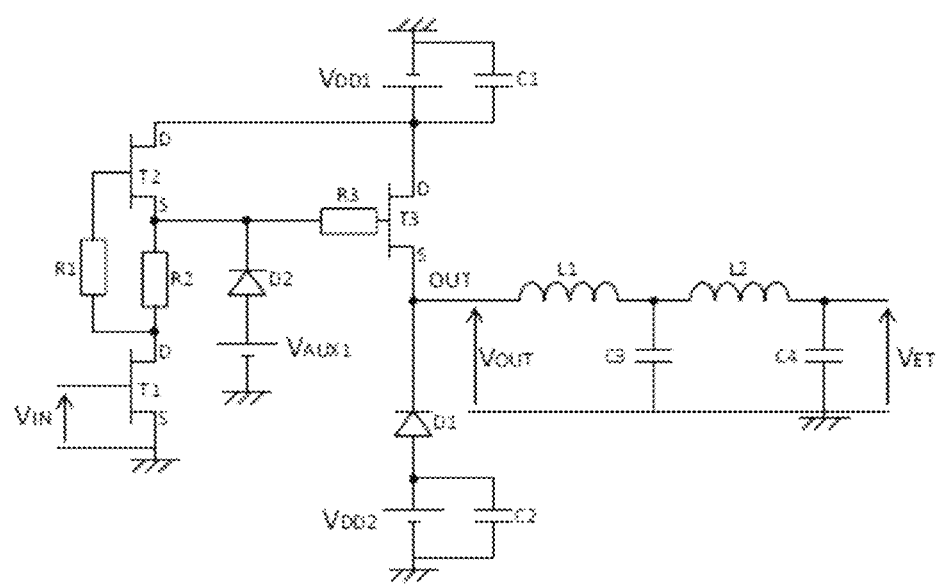

second power supply voltage, the first power supply voltage being greater than the second power supply voltage.

17 Claims, 2 Drawing Sheets

(51) Int. Cl.
*H02M 1/08* (2006.01)
*H03F 1/02* (2006.01)
*H03F 3/193* (2006.01)
*H03F 3/21* (2006.01)
*H03K 17/687* (2006.01)

(52) U.S. Cl.
CPC ......... *H03F 1/0227* (2013.01); *H03F 3/193* (2013.01); *H03F 3/21* (2013.01); *H03K 17/6871* (2013.01); *H03F 2200/102* (2013.01); *H03F 2200/504* (2013.01); *H03K 2017/6875* (2013.01); *Y02B 70/1466* (2013.01)

(58) Field of Classification Search
USPC .................................................. 330/297, 311
See application file for complete search history.

(56) References Cited

U.S. PATENT DOCUMENTS

| | | | |
|---|---|---|---|
| 8,072,202 B2* | 12/2011 | Yang | H02M 3/1588 323/282 |
| 2006/0198173 A1 | 9/2006 | Rozman | |
| 2007/0096812 A1* | 5/2007 | Lee | H03F 1/26 330/251 |
| 2008/0122418 A1 | 5/2008 | Briere et al. | |
| 2008/0136390 A1 | 6/2008 | Briere | |
| 2010/0259231 A1 | 10/2010 | McCune, Jr. | |
| 2011/0074375 A1 | 3/2011 | Yang et al. | |
| 2011/0080156 A1 | 4/2011 | Briere et al. | |
| 2011/0216563 A1 | 9/2011 | Ribarich | |
| 2012/0062323 A1 | 3/2012 | Le Gallou et al. | |
| 2012/0098038 A1 | 4/2012 | Shono | |
| 2013/0200865 A1 | 8/2013 | Wimpenny | |
| 2013/0207731 A1 | 8/2013 | Balteanu | |
| 2014/0022012 A1 | 1/2014 | Wilson | |
| 2015/0053994 A1 | 2/2015 | Shitou | |

FOREIGN PATENT DOCUMENTS

| | | |
|---|---|---|
| EP | 2 229 696 A1 | 9/2010 |
| EP | 2 518 880 A2 | 10/2012 |
| EP | 2 594 016 A1 | 5/2013 |
| EP | 2 706 651 A2 | 3/2014 |
| EP | 2 816 729 A1 | 12/2014 |
| EP | 2 824 700 A1 | 1/2015 |
| EP | 2 824 838 A1 | 1/2015 |
| WO | 2004/086598 A2 | 10/2004 |
| WO | 2009/002541 A1 | 12/2008 |
| WO | 2009/088391 A1 | 7/2009 |
| WO | 2011/120996 A1 | 10/2011 |
| WO | 2012/009410 A1 | 1/2012 |
| WO | 2012/020144 A2 | 2/2012 |
| WO | 2012/072503 A1 | 6/2012 |
| WO | 2014/118342 A2 | 8/2014 |
| WO | 2014/210308 A1 | 12/2014 |

OTHER PUBLICATIONS

Kanbe, A et al.: "New architecture for envelope-tracking power amplifier for base station," Circuits and Systems, 2008. APCCAS 2008. IEEE Asia Pacific Conference on, vol., No., pp. 296, 299, Nov. 30, 2008-Dec. 3, 2008.
Garcia, O. et al.: "An overview of fast DC-DC converters for envelope amplifier in RF transmitters," Applied Power Electronics Conference and Exposition (APEC), 2012 Twenty-Seventh Annual IEEE, vol., No., pp. 1313,1318, Feb. 5-9, 2012.
Shinjo, S. et al.: "High speed, high analog bandwidth buck converter using GaN HEMTs for envelope tracking power amplifier applications," Wireless Sensors and Sensor Networks (WiSNet), 2013 IEEE Topical Conference on , vol., No., pp. 13,15, Jan. 20-23, 2013.
Young-Pyo Hong et al.: "High efficiency GaN switching converter IC with bootstrap driver for envelope tracking applications," Radio Frequency Integrated Circuits Symposium (RFIC), 2013 IEEE , vol., No., pp. 353,356, Jun. 2-4, 2013.
Yuanzhe Zhang et al.: "100 MHz, 20 V, 90% efficient synchronous buck converter with integrated gate driver," Energy Conversion Congress and Exposition (ECCE), 2014 IEEE , vol., No., pp. 3664,3671, Sep. 14-18, 2014.
Jinseong Jeong et al.: "High-Efficiency WCDMA Envelope Tracking Base-Station Amplifier Implemented With GaAs HVHBTs," Solid-State Circuits, IEEE Journal of, vol. 44, No. 10, pp. 2629,2639, Oct. 2009.
International Search Report, dated Aug. 19, 2016, from corresponding PCT/FR2016/051240 application.

* cited by examiner

DC-DC CONVERTER BLOCK, DC-DC CONVERTER COMPRISING SAME AND ASSOCIATED SYSTEM ENVELOPE TRACKING SYSTEM

The present invention relates to the field of DC-DC converters, and particularly to a high-power and high-frequency DC-DC converter block for the envelope tracking technique, to a DC-DC converter comprising the same, and to an associated envelope tracking system.

The constant increase of wireless communication bit rates requires the use of complex modulations with high spectral efficiency such as OFDM (orthogonal frequency division multiplexing), these modulations having significant crest factors (ratio between the peak power and the average power of the signal).

The RF power amplifiers which are powered by a DC power supply voltage provide a maximum power efficiency only when they operate in compression, that is, at the peak power of the signal to be transmitted. However, most of the time, the amplifier outputs a power well below its maximum power, close to the average power of the signal to be transmitted, the power efficiency of the amplifier being in these conditions well below its maximum power efficiency.

The envelope tracking technique is a power supply technique for improving the power efficiency of the RF power amplifiers, this technique replacing the DC constant power supply of the amplifier by a DC dynamic power supply which follows the amplitude of the RF signal to be transmitted. The envelope tracking technique allows to dynamically adjust the power supply voltage of the RF power amplifier such that the latter always operates in compression, and thus at its maximum power efficiency, regardless of the power level of the envelope of the RF signal, this technique allowing for the modern modulation formats to significantly improve the power efficiency of the RF power amplifiers while meeting the requirements of the standards in terms of linearity.

In the case of an envelope-tracking RF power amplifier, the power supply voltage is by definition constantly readjusted so as to ensure that the amplifier always operates in compression, and thus at its maximum power efficiency, regardless of the desired power level for emission.

The power supply voltage of an envelope-tracking RF power amplifier is generally generated by an hybrid DC-DC converter (also called supply modulator) allowing to generate a wide-band DC control signal. The hybrid DC-DC converter has a pure-switching high power efficiency DC-DC converter part operating at low frequencies and a linear amplification part allowing to follow the quick variations of the envelope signal. However, the linear amplification part which exhibits a low efficiency significantly damages the overall power efficiency of the hybrid DC-DC converter. Further, the more significant the bandwidth covered by the linear amplification part, the more the overall power efficiency is affected by the low efficiency of the linear amplification part.

Another known technique commonly used to generate an envelope-tracking DC control signal relies only on the sole use of a DC-DC converter which is switching, which must be sufficiently fast to meet the requirements in terms of bandwidth since it relies on a sigma-delta or PWM (pulse-width modulation) switching signal. However, this type of converter has a relatively limited bandwidth to support the envelope tracking technique. Architectures of multi-phase type switching DC-DC converter allow to improve the bandwidths of the converters without reaching a technological breakthrough in terms of power efficiency and bandwidth.

The high-efficiency and wide-band DC-DC conversion relies on switching converters, regardless of the type of modulator: hybrid or switching only. These converters rely directly on topologies and technologies conventionally used for converting power supply voltage.

These converters, mainly based on buck (voltage step-down) or boost (voltage step-up) architectures, use silicon MOSFET (metal-oxide-semiconductor field-effect transistor) transistors which have the advantage of being well tested and being available in complementary technologies (N or P channel), the gates of the MOSFET transistors being generally driven by silicon-integrated circuits implementing the bootstrap technique.

However, the silicon MOSFET transistors have a very limited switching frequency for high-power applications. The response to this problem requires the use of new materials such as gallium nitride (GaN). For such a material, HEMT (high electron mobility transistor) enhancement-mode (normally off) transistors or HEMT depletion-mode (normally on) transistors exist from different manufacturing processes. They allow to obtain higher operating frequencies, but use bootstrap-type gate driving devices always made of silicon. Further, the use of HEMT depletion-mode (normally on) transistors together with a bootstrap-type gate driving device raises an obvious problem during the initiating phase of the circuit, the bootstrap-type gate drive device requiring to continuously switch the transistors.

The manufacturers of switching power supplies thus use HEMT enhancement-mode transistors with GaN driven by silicon bootstrap-type driving devices, this type of transistor being developed in particular for power supply voltage conversion applications and allowing to significantly improve the performances with respect to silicon MOSFET transistors without competing with the HEMT depletion-mode transistors conventionally used in very-high-frequency amplification applications.

The constant increase of modulation bandwidths thus requires, regardless of the architecture of the supply modulator used, to arrange DC-DC converters capable to operate at very-high switching frequencies, these frequencies being well above those the available technologies of DC-DC converters can provide, especially in the case of high-power applications.

The HEMT depletion-mode (normally on) transistors with GaN, generally used for microwave amplification applications, allow to potentially reach very-high operating frequencies. However, neither the silicon bootstrap-type gate driving devices nor the existing topologies of the DC-DC converters allow to actually use this type of component for switching power supply applications or within step-down-type very-high-frequency DC-DC converters for the envelope tracking technique.

The present invention is intended to solve the disadvantages of the prior art, by providing a high-power and high-frequency DC-DC converter block for the envelope tracking technique for high-power microwave and/or radio frequency amplification applications so as to allow a technological breakthrough concerning the power efficiency-bandwidth limitation imposed by the existing DC-DC converters which, until now, made the envelope tracking technique difficult to implement for high-power applications with high bit rates, said DC-DC converter block according to the present invention comprising a step-down power circuit with at least one HEMT depletion-mode transistor and a driving circuit with HEMT depletion-mode transistors, the power circuit being powered by two positive and non-zero power supply voltages.

The present invention also relates to a DC-DC converter comprising the DC-DC converter block and to a system for the envelope tracking technique comprising a DC-DC converter for the envelope tracking technique according to the present invention and a radio frequency (RF) power amplifier.

The present invention thus relates to a high-power and high-frequency DC-DC converter block for the envelope tracking technique comprising a step-down power circuit whose output constitutes the output of the DC-DC converter block, the step-down power circuit comprising at least one HEMT (high electron mobility transistor) depletion-mode transistor, the DC-DC converter block further comprising a gate driving circuit of the at least one HEMT depletion-mode transistor of the step-down power circuit, characterized in that the driving circuit has HEMT depletion-mode transistors configured to drive the gate of the at least one HEMT depletion-mode transistor of the step-down power circuit, and in that the step-down power circuit is powered by two positive and non-zero power supply voltages, namely a first power supply voltage and a second power supply voltage, the first power supply voltage being greater than the second power supply voltage.

High power means powers greater than 1 W.

High frequencies mean switching frequencies greater than 10 MHz.

Thus, the DC-DC converter block is particularly suitable for the envelope tracking technique, the HEMT depletion-mode (normally on) microwave transistors being particularly suitable for high-power applications with high switching frequencies.

Different technologies of semiconductors can be used to make HEMT depletion-mode transistors, these materials mainly being gallium nitride (GaN) and gallium arsenide (GaAs), but also any other semiconductor material with materials of the group III-V such as AlGaN, AlN, InAlN, InAlGaN, etc.

The use of HEMT depletion-mode RF and microwave transistors provides a high potential in terms of operating frequency by their very-low parasitic capacitances, this type of transistors conventionally allowing to handle power amplification functions up to several tens of gigahertz, this type of transistor further providing the advantages of being available according to different gate peripheries and being able to be easily integrated within MMIC (monolithic microwave integrated circuits) monolithic circuits.

In addition, the very-low parasitic capacitances of these HEMT depletion-mode transistors associated to high breakdown voltages make this type of components particularly adapted to high-power (>1 W) wide-band DC-DC conversion applications.

The HEMT depletion-mode transistors further have the advantage of being able to be used in forward and reverse conduction. They thus do not necessarily require Schottky diodes arranged in parallel for the management of reverse currents, which allows to minimize the parasitic capacitances and thus to obtain higher switching frequencies.

The gate driving circuit is integrated to the DC-DC converter block in the same technology, that is, comprising HEMT depletion-mode transistors, which allows to obtain an low-consumption and ultra-fast gate driving circuit.

The architecture of the DC-DC converter block with a step-down power circuit is particularly optimized for the envelope tracking technique through the use of two power supply voltages which bound the voltage generated by the DC-DC converter block, which allows to significantly minimize the losses during the switching phases of the DC-DC converter block, the first power supply voltage having to be greater than the second power supply voltage so as to ensure the proper operation of the DC-DC converter block.

In addition, the use of a step-down power circuit also has the advantage of being easy to drive when used for the envelope tracking technique. Indeed, the step-down power circuit is easier to control than a voltage amplifier type power circuit because it can be easily used without any feedback loop chain even in the case where it is subjected to variations of load impedance or worse to the absence of a load.

According to a first embodiment of the invention, the step-down power circuit is of asynchronous type and has a HEMT depletion-mode power transistor and a Schottky power diode, the conduction input terminal of the power transistor being connected to the first power supply voltage, the anode of the power diode being connected to the second power supply voltage, the output of the step-down power circuit being connected to the conduction output terminal of the power transistor and to the cathode of the power diode, and the gate of the power transistor being connected to the driving circuit of the DC-DC converter block, such that the output voltage of the step-down power circuit of the DC-DC converter block is bounded by the first and second power supply voltages.

The HEMT power transistors can operate in forward (quadrant (Vds, Ids)>0) or reverse (quadrant (Vds, Ids)<0) conduction. In forward conduction, the conduction input terminal is the drain and the conduction output terminal is the source. In reverse conduction, the conduction input terminal is the source and the conduction output terminal is the drain.

Thus, when the driving circuit drives the gate of the power transistor so as to open the latter, the output voltage of the step-down power circuit is equal to the second power supply voltage and, when the driving circuit drives the gate of the power transistor so as to close the latter, the output voltage of the step-down power circuit is equal to the first power supply voltage, the output voltage of the step-down power circuit of the DC-DC converter block being thus bounded by the first and second power supply voltages.

The power diode can be of Schottky type made of Si, SiC, GaAs or GaN technology, but can also be based on semiconductor materials with materials of the group III-V such as AlGaN, AlN, InAlN, InAlGaN, etc.

According to a second embodiment of the invention, the step-down power circuit is of synchronous type and has a first HEMT depletion-mode power transistor and a second HEMT depletion-mode power transistor, the conduction input terminal of the first power transistor being connected to the first power supply voltage, the conduction output terminal of the second power transistor being connected to the second power supply voltage, the output of the step-down power circuit being connected to the conduction output terminal of the first power transistor and to the conduction input terminal of the second power transistor, and the gates of the first and second power transistors being connected to the driving circuit of the DC-DC converter block, such that the output voltage of the step-down power circuit of the DC-DC converter block is bounded by the first and second power supply voltages.

Thus, when the driving circuit drives the gate of the first power transistor so as to close the latter and the gate of the second power transistor so as to open the latter, the output voltage of the step-down power circuit is equal to the first power supply voltage and, when the driving circuit drives the gate of the first power transistor so as to open the latter and the gate of the second power transistor so as to close the latter, the output voltage of the step-down power circuit is equal to the second power supply voltage, the output voltage of the step-down power circuit of the DC-DC converter block being thus bounded by the first and second power supply voltages.

Contrary to the asynchronous step-down power circuit in which the power diode can, in some cases, limit the performances of the DC-DC converter block, said power diode having both a very-low voltage drop and a very-low parasitic capacitance value, the synchronous step-down power circuit uses, instead of the power diode, a second HEMT depletion-mode power transistor, which allows to benefit from the advantages of the transistor for which the voltage drop is directly proportional to the current circulating therethrough.

According to a particular feature of the invention, the DC-DC converter block further comprises power supply decoupling capacitors respectively arranged in parallel to the first and second power supply voltages.

Thus, the power supply decoupling capacitors allow to ensure the stability of the high-frequency HEMT transistors and to filter parasites present in the power supply voltages.

According to a particular feature of the invention, the driving circuit has, for each gate of HEMT depletion-mode transistor of the step-down power circuit to drive, a first HEMT depletion-mode drive transistor, a second HEMT depletion-mode drive transistor, first, second and third resistors, a Schottky diode and an auxiliary power supply voltage, the source of the first drive transistor being connected to the ground, the drain of the first drive transistor being connected to one of the terminals of the first resistor and to one of the terminals of the second resistor, the gate of the first drive transistor being connected to a corresponding input of the driving circuit, the gate of the second drive transistor being connected to the other of the terminals of the first resistor, the source of the second drive transistor being connected to the other of the terminals of the second resistor, to the cathode of the Schottky diode and to one of the terminals of the third resistor, the anode of the Schottky diode being connected to the auxiliary power supply voltage, the other of the terminals of the third resistor being connected to the gate of the HEMT depletion-mode transistor of the corresponding to-be-driven step-down power circuit, the drain of the second drive transistor being connected to the first power supply voltage if the latter is connected to the conduction input terminal of the HEMT depletion-mode transistor of the corresponding to-be-driven step-down power circuit or being connected to the second power supply voltage if the latter is connected to the conduction output terminal of the HEMT depletion-mode transistor of the corresponding to-be-driven step-down power circuit, the auxiliary power supply voltage being greater than the pinch-off voltage of the second drive transistor, and the second power supply voltage being greater than the auxiliary power supply voltage plus the pinch-off voltage of the HEMT depletion-mode transistor of the corresponding to-be-driven step-down power circuit.

Thus, this specific topology of the driving circuit allows to minimize the losses when switching the DC-DC converter block.

Each Schottky diode of the driving circuit can be made of Si, SiC, GaAs or GaN technology, but can also be based on semiconductor materials with materials of the group III-V such as AlGaN, AlN, InAlN, InAlGaN, etc.

The architecture of the gate driving circuit of the power transistor(s) makes the DC-DC converter block extremely flexible in terms of frequency. Indeed, the gate driving circuit of the power transistor(s) being coupled in direct current, there is no limitation in terms of minimum or maximum switching frequencies, the maximum switching frequency being actually limited by the second resistor of the driving circuit, by the gate-source capacitance (CGS) of the second drive transistor of the driving circuit, and by the performances of the HEMT depletion-mode transistors themselves.

The specific architecture of the gate driving circuit thus allows to obtain very-high switching speeds.

In addition, for each HEMT depletion-mode transistor of the step-down power circuit to be driven, the part of the driving circuit associated to the corresponding to-be-driven power transistor exhibits a zero consumption when it turns on the corresponding power transistor, and consumes little power when the corresponding power transistor is off, through the use of an auxiliary power supply and of the diode arranged at the output of this auxiliary power supply.

The auxiliary power supply voltage must be greater than the pinch-off voltage of the second drive transistor such that the latter can be off, and the second power supply voltage must be greater than the auxiliary power supply voltage plus the pinch-off voltage of the HEMT depletion-mode transistor of the corresponding to-be-driven step-down power circuit such that the corresponding HEMT depletion-mode transistor of the step-down power circuit can be off.

The first and third resistors are stabilization resistors allowing to control the risk of oscillation of the HEMT depletion-mode transistors having very-high gains.

The second resistor directly affects the switching speed of the gate driving circuit, a lower value of the second resistor causing, for a given second drive transistor gate periphery, an increased switching speed but involving a higher electrical consumption when the to-be-driven power transistor is off, a tradeoff between speed and consumption of the driving circuit thus existing for a given second drive transistor gate periphery.

It can be noted that, when the step-down power circuit of the DC-DC converter block is of asynchronous type, the driving circuit has a single power transistor gate driving part and, when the step-down power circuit of the DC-DC converter block is of synchronous type, the driving circuit has two power transistor gate driving parts driving respectively the gates of two power transistors.

According to a particular feature of the invention, each input voltage at a corresponding input of the driving circuit is negative and between 0V and $-V_p$, Vp being the pinch-off voltage of the drive transistor whose gate is connected to said corresponding input of the driving circuit, said input voltage being output by an interface circuit connected to a sigma-delta or PWM (pulse-width modulation) control digital circuit.

Thus, in these operating conditions of the envelope tracking technique, the use of digital control cyclic ratios varying on the entire range possible, namely 0% to 100%, allows to minimize the recurrence of switchings to be performed, and thus to maximize the power efficiency of the DC-DC converter block.

The control digital circuit is one of a digital signal processor (DSP), a field programmable gate array (FPGA), an application specific integrated circuit (ASIC) or any other digital circuit allowing to drive the DC-DC converter block.

The interface circuit allows to provide each input voltage to the driving circuit from the digital control provided by the control digital circuit.

According to a particular feature of the invention, when the step-down power circuit is of synchronous type, both input voltages of the driving circuit are complementary.

Thus, the driving of two power transistors are complementary, such that one of both power transistors is on while the other of both power transistors is off, and vice versa.

It can be noted that the control digital circuit is configured to compensate for the rise and fall time differences, also called dead times, between both power transistors to be driven.

According to a particular feature of the invention, the gate peripheries of the HEMT depletion-mode transistors of the driving circuit are smaller than those of the HEMT depletion-mode transistor(s) of the step-down power circuit.

This has the advantage of significantly minimizing the parasitic capacitance (CGS) of the second drive transistor, and thus to allow to use values of the second resistor which are high enough such that the driving circuit consumes little power.

According to a first variant of the invention, all components of the DC-DC converter block are discrete components mounted on a printed circuit board or connected thereto by linking wires. In this last case, the circuit is called "hybrid".

Thus, the DC-DC converter block can be made from discrete components such as transistors, diodes, resistors and capacitors into a package.

It can also be made from components into a chip within a hybrid circuit.

According to a second variant of the invention, all components of the DC-DC converter block are monolithically integrated within an integrated circuit.

Thus, this allows the integration of the DC-DC converter block and of a RF power amplifier supplied by the DC-DC converter block in a same technology, and thus integrated on a same chip, this integration can be directly monolithically performed within a MMIC circuit so as to increase the integration of the DC-DC converter block.

The electronic circuit can also comprise, if needed, a linear amplifier which will then be associated with the DC-DC converter block.

In the case of an implementation of MMIC type, the linear amplifier can be integrated on the MMIC.

According to a particular feature of the invention, the HEMT transistors of the step-down power circuit and the HEMT transistors of the driving circuit are made of any of gallium nitride (GaN), gallium arsenide (GaAs) or any other semiconductor material with materials of the group III-V.

According to a particular feature of the invention, the diodes are of Schottky type and made of Si, SiC, GaAs, GaN or any other semiconductor material with materials of the group III-V.

In addition, in the case of monolithic integration of the RF power amplifier and the DC-DC converter block, the technology of the transistors being identical, the voltage withstand requirements are directly compatibles.

The invention also relates to a high-power and high-frequency DC-DC converter for the envelope tracking technique, characterized in that it comprises a DC-DC converter block such as described above and an output filter connected to the output of the step-down power circuit of the DC-DC converter block, the filter being preferably composed of capacitors and inductors, the output of the output filter constituting the output of the high-power and high-frequency DC-DC converter.

Thus, the output filter, constituted for example by capacitors and inductors, allows to reconstruct the bias signal to be applied to the power supply voltage input of a RF power amplifier from a sigma-delta or PWM (pulse-width modulation) digital control signal by using digital control cyclic ratios varying on the entire range possible, namely 0% to 100%.

The present invention also relates to a high-power and high-frequency multi-phase DC-DC converter for the envelope tracking technique, wherein it comprises at least two DC-DC converters such as described above, mounted in parallel and powered by the same power supply voltages.

The present invention also relates to a system for the envelope tracking technique comprising a DC-DC converter for the envelope tracking technique or a multi-phase DC-DC converter for the envelope tracking technique according to the present invention, a radio frequency (RF) power amplifier and an envelope tracking processing digital circuit, the envelope tracking processing digital circuit controlling the DC-DC converter and the RF power amplifier, and the output of the DC-DC converter being connected to the power supply voltage input of the RF power amplifier.

The systems for the envelope tracking technique with conventional DC-DC converters are described in a general manner, for example, in the scientific publication "High-Efficiency WCDMA Envelope Tracking Base-Station Amplifier Implemented With GaAs HVHBTs"), Jinseong Jeong; Kimball, D. F.; Myoungbo Kwak; Draxler, P.; Chin Hsia; Steinbeiser, C.; Landon, T.; Krutko, O.; Larson, L. E.; Asbeck, P. M., Solid-State Circuits, IEEE Journal, vol. 44, no. 10, pp. 2629, 2639, October 2009.

Thus, the first power supply voltage of the DC-DC converter corresponds to the maximum power supply voltage of the RF power amplifier when the latter provides a maximum output power, and the second power supply voltage of the DC-DC converter corresponds to the minimum power supply voltage of the RF power amplifier when its output power is low. Both power supply voltages are thus selected according to the microwave electrical characteristics of the RF power amplifier to be controlled according to the envelope tracking technique.

To better illustrate the subject-matter of the present invention, two preferred embodiments will now be described below, for illustrative and non-limiting purposes, in reference to the appended drawings.

Figure 2:
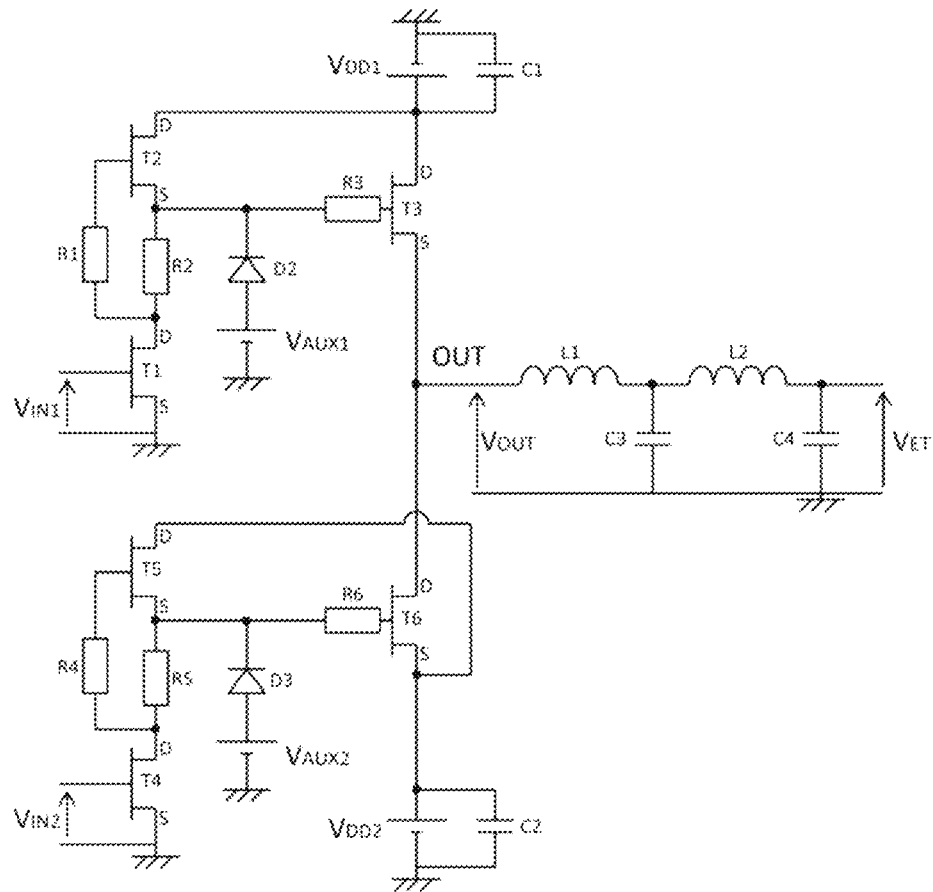

In these drawings:

FIG. 1 is a principle diagram of a DC-DC converter for the envelope tracking technique according to a first embodiment of the present invention; and FIG. 2 is a principle diagram of a DC-DC converter for the envelope tracking technique according to a second embodiment of the present invention.

Now referring to FIG. 1, it is shown a DC-DC converter for the envelope tracking technique according to a first embodiment of the present invention, comprising a DC-DC converter block and an output filter.

The DC-DC converter block for the envelope tracking technique comprises an asynchronous step-down power circuit powered by two positive and non-zero power supply voltages, namely a first power supply voltage VDD1 and a second power supply voltage VDD2, the first power supply voltage VDD1 being greater than the second power supply voltage VDD2, and a driving circuit of the step-down power circuit.

The first and second power supply voltages VDD1 and VDD2 are selected according to the microwave electrical characteristics of a RF power amplifier powered by the DC-DC converter, and can have, for example, values of 50V and 10V, respectively.

The step-down power circuit comprises a HEMT depletion-mode power transistor T3 and a Schottky power diode D1, the drain of the power transistor T3 being connected to the first power supply voltage VDD1, the anode of the power diode D1 being connected to the second power supply voltage VDD2, the output OUT of the step-down power circuit being connected to the source of the power transistor T3 and to the cathode of the power diode D1, and the gate of the power transistor T3 being connected to the driving circuit of the DC-DC converter block, such that the output voltage VOUT of the step-down power circuit of the DC-DC converter block is bounded by the first and second power supply voltages VDD1 and VDD2.

The power transistor T3 has, for example, a gate periphery of 10 mm with GaN material, and the power diode D1 has, for example, an allowable maximum current of 3 A.

The DC-DC converter block further comprises power supply decoupling capacitors C1 and C2 respectively arranged in parallel to the first and second power supply voltages VDD1 and VDD2.

The capacitors C1 and C2 have, for example, values between 10 pF and 1 nF, respectively, the one skilled in the art knowing how to adjust the values according to the other components and to the required characteristics.

It can be noted that the DC-DC converter block may not have power supply decoupling capacitors, without departing from the scope of the present invention.

It can be noted that the DC-DC converter block may not have stabilization resistors (R1, R3, R4, R6).

The DC-DC converter further comprises an output filter connected to the output OUT of the step-down power circuit of the DC-DC converter block, the output filter comprising two inductors L1 and L2 and two capacitors C3 and C4, one of the terminals of the inductor L1 being connected to the output OUT of the step-down power circuit of the DC-DC converter block, the other of the terminals of the inductor L1 being connected to one of the terminals of the inductor L2 and to one of the terminals of the capacitor C3, the other of the terminals of the inductor L2 being connected to one of the terminals of the capacitor C4, the other of the terminals of the capacitor C3 and the other of the terminals of the capacitor C4 being connected to the ground, and the bias signal VET to be applied to the bias voltage input of a RF power amplifier to be powered being collected at the connection between the inductor L2 and the capacitor C4.

The inductor L1, the inductor L2, the capacitor C3 and the capacitor C4 have values determined by the one skilled in the art according to the other parameters, especially the bandwidth of the signal to be transmitted, the switching frequency, and the topology of the filter.

It can be noted that the architecture of the output filter is given here for exemplary purposes and could also adopt any another architecture, without departing from the scope of the present invention, said output filter being, in any case, configured to reconstruct the bias signal VET from a sigma-delta or PWM control digital signal, the DC-DC converter being used for sigma-delta or PWM control cyclic ratios varying from 0% to 100%.

The driving circuit is configured to drive the gate of the power transistor T3, and has a first HEMT depletion-mode drive transistor T1, a second HEMT depletion-mode drive transistor T2, first, second and third resistors R1, R2, R3, a Schottky diode D2 and an auxiliary power supply voltage VAUX1, the source of the first drive transistor T1 being connected to the ground, the drain of the first drive transistor T1 being connected to one of the terminals of the first resistor R1 and to one of the terminals of the second resistor R2, the gate of the first drive transistor T1 being connected to an input VIN1 of the driving circuit, the gate of the second drive transistor T2 being connected to the other of the terminals of the first resistor R1, the source of the second drive transistor T2 being connected to the other of the terminals of the second resistor R2, to the cathode of the Schottky diode D2 and to one of the terminals of the third resistor R3, the anode of the Schottky diode D2 being connected to the auxiliary power supply voltage VAUX1, the other of the terminals of the third resistor R3 being connected to the gate of the HEMT depletion-mode transistor T3 of the step-down power circuit, the drain of the second drive transistor T2 being connected to the first power supply voltage VDD1.

The auxiliary power supply voltage VAUX1 is greater than the pinch-off voltage of the second drive transistor T2 such that the latter can open, and the second power supply voltage VDD2 is greater than the auxiliary power supply voltage VAUX1 plus the pinch-off voltage of the HEMT depletion-mode transistor T3 such that the latter can open.

The gate periphery of the HEMT depletion-mode transistors T1 and T2 of the driving circuit are much lower than that of the HEMT depletion-mode transistor T3 of the step-down power circuit. The drive transistors T1 and T2 have, for example, gate periphery 10 to 30 times lower than the transistor T3.

The first, second and third resistors R1, R2 and R3 have, for example, values of 10 Ohms, 50 Ohms and 10 Ohms, respectively.

These values obviously depend on many factors such as the transistors or the technology used. They are thus indicated here for illustrative and non-limiting purposes, and the one skilled in the art would know how to adapt them according to the converter characteristics.

The auxiliary voltage VAUX1 is, for example, 3V.

It can be noted that the HEMT depletion-mode transistors T1, T2 and T3 have the advantage of being able to be used in forward or reverse conduction, and thus do not necessarily require the use of antiparallel Schottky diodes for the management of reverse currents, which allows to minimize the parasitic capacitance within the circuit.

Different technologies of semiconductors can be used for making the HEMT depletion-mode transistors T1, T2 and T3, these materials mainly being gallium nitride (GaN) and gallium arsenide (GaAs), but also any other semiconductor material with materials of the group III-V such as AlGaN, AlN, InAlN, InAlGaN, etc.

The Schottky diodes D1 and D2 can be made of Si, SiC, GaAs or GaN technology, but can also be based on semiconductor materials with materials of the group III-V such as AlGaN, AlN, InAlN, InAlGaN, etc.

The input voltage VIN1 at the input of the driving circuit is negative and between 0V and −Vp, Vp being the pinch-off voltage of the drive transistor T1, said input voltage VIN1 being output by an interface circuit (not shown in FIG. 1) connected to a sigma-delta or PWM (pulse-width modulation) control digital circuit (not shown in FIG. 1).

The control digital circuit is one of a digital signal processor (DSP), a field programmable gate array (FPGA), an application specific integrated circuit (ASIC) or any other digital circuit allowing to drive the DC-DC converter block.

The interface circuit allows to provide the input voltage to the driving circuit from the digital control provided by the control digital circuit.

The driving circuit of the DC-DC converter being controlled by a sigma-delta or PWM digital signal, two states are possible for characterizing this DC-DC converter block.

In a first state, called "shutdown state" in which the control digital signal imposes an input voltage VIN1=0V, the drive transistor T1 is on, the gate of the drive transistor T2 is grounded as well as the terminal of the second resistor R2 connected to the drain of the drive transistor T1, thereby imposing a current within the second resistor R2 from the auxiliary power supply VAUX1 through the diode D2. The resulting voltage at the terminals of the second resistor R2 turns off the drive transistor T2 and the auxiliary voltage VAUX1 is applied to the gate of the power transistor T3 to be driven. The power diode D1 being then conducting, the output voltage VOUT of the step-down power circuit is equal to the second power supply voltage VDD2, and the voltage difference between VAUX1 and VAUX2 turns off the power transistor T3. Thus, in this state, the consumption of the driving circuit is reduced to the current passing through the second resistor R2 and the diode D2 from the auxiliary voltage VAUX1.

Due to the fact that the transistors used are HEMT microwave transistors having very-high gains, there is a risk of oscillation (instability) of said transistors. To control this risk, the first and third resistors R1 and R3 which are stabilization resistors have been positioned on the gates of the first drive transistor T1 and the to-be-driven power transistor T3.

In a second state, called "activation state" in which the control digital signal imposes an input voltage VIN1=−Vp, the drive transistor T1 is off. The current within the second resistor R2 being zero, the gate-source voltage of the drive transistor T2 is equal to 0V and the drive transistor T2 is thus on, thereby imposing the first power supply voltage VDD1 on the gate of the power transistor T3 and turn off the diode D2. The power transistor T3 is thus on, imposing the first power supply voltage VDD1 on the output voltage VOUT of the step-down power circuit and turn off the power diode D1. In this state, the diode D2 and the drive transistor T1 being off, the consumption of the gate driving circuit is zero.

The second resistor R2 directly affects the switching speed of the gate driving circuit. For a given drive transistor T2 gate periphery, a lower value of the second resistor R2 will cause an increased switching speed, but will involve an increased consumption when the to-be-driven power transistor T3 is off. Thus, there is, for a given drive transistor T2 gate periphery, a tradeoff between speed and consumption of the driving circuit.

However, the architecture of the DC-DC converter block has the advantage that the drive transistors T1 and T2 for very-low gate peripheries with respect to the gate periphery of the power transistor T3 are sufficient to drive T3 as it is not necessary to provide a high current to drive the gate of the power transistor T3. This has the advantage of significantly minimizing the gate-source parasitic capacitance of the drive transistor T2, which thus will be very low and therefore will allow to use values of the second resistor R2 high enough such that consumption of the driving circuit is low.

All components of the DC-DC converter are either discrete components mounted on a printed circuit board, or monolithically integrated within an integrated circuit.

In the case of a monolithic integration, this can allow the integration of the DC-DC converter and of a RF power amplifier powered by the DC-DC converter in a same technology, and thus integrated on a same chip, this integration could directly be monolithically performed within a MMIC circuit so as to increase the integration of the DC-DC converter.

If referring to FIG. 2, it is shown a DC-DC converter for the envelope tracking technique according to a second embodiment of the present invention.

The DC-DC converter for the envelope tracking technique according to the second embodiment is identical to the DC-DC converter according to the first embodiment, except that the step-down power circuit of the DC-DC converter block according to the second embodiment is of synchronous type and has a second HEMT depletion-mode power transistor T6 instead of the power diode D1 of the first embodiment, the gate of the second power transistor T6 being driven by an additional part of the driving circuit, the source of the second power transistor T6 being connected to the second supply voltage VDD2, the output OUT of the step-down power circuit being connected to the source of the first power transistor T3 and to the drain of the second power transistor T6, and the gate of the second power transistor T6 being connected to the driving circuit of the DC-DC converter block, such that the output voltage VOUT of the step-down power circuit of the DC-DC converter block is bounded by the first and second power supply voltages VDD1 and VDD2.

The driving circuit further comprises an additional gate driving part of the second power transistor T6 whose structure is identical to the gate driving structure of the first power transistor T3 and having a first HEMT depletion-mode drive transistor T4, a second HEMT depletion-mode drive transistor T5, first, second and third resistors R4, R5, R6, a Schottky diode D3 and an auxiliary power supply voltage VAUX2, the source of the first drive transistor T4 being connected to the ground, the drain of the first drive transistor T4 being connected to one of the terminals of the first resistor R4 and to one of the terminals of the second resistor R5, the gate of the first drive transistor T4 being connected to a corresponding input VIN2 of the driving circuit, the gate of the second drive transistor T5 being connected to the other of the terminals of the first resistor R4, the source of the second drive transistor T5 being connected to the other of the terminals of the second resistor R5, to the cathode of the Schottky diode D3 and to one of the terminals of the third resistor R6, the anode of the Schottky diode D3 being connected to the auxiliary power supply voltage VAUX2, the other of the terminals of the third resistor R6 being connected to the gate of the HEMT depletion-mode transistor T6 of the corresponding to-be-driven step-down power circuit, the drain of the second drive transistor T5 being connected to the second supply voltage VDD2, the auxiliary power supply voltage VAUX2 being greater than the pinch-off voltage of the second drive transistor T5, and the second power supply voltage VDD2 being greater than the auxiliary power supply voltage VAUX2 plus the pinch-off voltage of the HEMT depletion-mode transistor T6.

In practice, VAUX1 can advantageously be equal to VAUX2.

The auxiliary voltage VAUX2 is, for example, 3V.

Both input voltages VIN1 and VIN2 of the driving circuit are complementary, which requires an additional reversed (or complemented) sigma-delta or PWM digital control with respect to the first digital control, such that VIN2=0V when VIN1=−Vp_T1 V and VIN2=−Vp_T4 when VIN1=0V.

The operation of the power transistor T3 and its associated driving circuit part is identical to that of the first embodiment.

The operation of the power transistor T6 and of its associated driving circuit part is similar to that of the power transistor T3. However, this power transistor T6 is used in the activation state with slightly negative drain-source voltages VDS and a negative drain-source current IDS.

In this synchronous DC-DC converter block, the activation state is defined as the state in which the power transistor T3 is on. The power transistor T6 is then turns off and the first supply voltage VDD1 is applied to the output voltage VOUT of the step-down power circuit of the DC-DC converter block. On the contrary, in the shutdown state in which the power transistor T3 is turn off, the power transistor T6 is on, and thus the second power supply voltage VDD2 is applied to the output voltage VOUT of the step-down power circuit of the DC-DC converter block.

It can be noted that the control digital circuit can be configured to compensate for the rise and fall time differences, also called dead times, between both power transistors T3 and T6.

The HEMT power transistors can operate in forward or reverse conduction, that is, according to two quadrants (VDS, IDS)>0 or (VDS, IDS)<0, which means that each power transistor T3 or T6, for the asynchronous and synchronous topologies, can be mounted by reversing the drain and the source, the wiring of the driving circuit remaining unchanged in these conditions. In the case of the synchronous topology, each of the power transistors T3 and T6 can be reversed independently from the other of the power transistors T3 and T6.

It can be noted that the drive diodes D2 and D3 could be replaced with HEMT transistors with the same technology as the other transistors of the circuit, without departing from the scope of the present invention.

The DC-DC converter for the envelope tracking technique according to the present invention can also be used within a multi-phase DC-DC converter architecture, that is, simultaneously using in parallel several DC-DC converters according to the present invention with both power supply voltages VDD1 and VDD2 in common. In these conditions, the resulting multi-phase DC-DC converter will also be particularly adapted for the envelope tracking technique, allowing to support higher total output power and to improve the rejection of the switching frequency, the importance of a good rejection being essential for the envelope tracking applications.

The invention also relates to a system for the envelope tracking technique comprising a DC-DC converter for the envelope tracking technique according to the first embodiment or the second embodiment of the present invention, a radio frequency (RF) power amplifier and an envelope tracking processing digital circuit, the envelope tracking processing digital circuit controlling the DC-DC converter and the RF power amplifier, and the output of the DC-DC converter being connected to the supply voltage input of the RF power amplifier.

Thus, the first power supply voltage VDD1 of the DC-DC converter corresponds to the maximum power supply voltage of the RF power amplifier when the latter provides a maximum output power, and the second power supply voltage VDD2 of the DC-DC converter corresponds to the minimum power supply voltage of the RF power amplifier when its output power is low.

The invention claimed is:

1. A high-power and high-frequency DC-DC converter block for the envelope tracking technique comprising a step-down power circuit whose output constitutes the output of the DC-DC converter block, the step-down power circuit comprising at least one HEMI (high electron mobility transistors) depletion-mode transistor (T3; T6), the DC-DC converter block further comprising a gate driving circuit of the at least one HEMI depletion-mode transistor (T3, T6) of the step-down power circuit, wherein the gate driving circuit comprises HEMI depletion-mode transistors (T1, T2; 14, T5) configured to drive the gate of the at least one HEMI depletion-mode transistor (T3; T6) of the step-down power circuit, and wherein the step-down power circuit is powered by two positive and non-zero power supply voltages referenced to ground, namely a first power supply voltage (VDD1) and a second power supply voltage (VDD2), the first power supply voltage (VDD1) being greater than the second power supply voltage (VDD2).

2. The DC-DC converter block according to claim 1, wherein the step-down power circuit is of asynchronous type and comprises a HEMI depletion-mode power transistor (T3) and a Schottky power diode (D1), the conduction input terminal of the HEMT depletion-mode power transistor (T3) being connected to the first power supply voltage (VDD1), the anode of the Schottky power diode (D1) being connected to the second power supply voltage (VDD2), the output (OUT) of the step-down power circuit being connected to the conduction output terminal of the HEMT depletion-mode power transistor (T3) and to the cathode of the Schottky power diode (D1), and the gate of the HEMT depletion-mode power transistor (T3) being connected to the gate driving circuit of the DC-DC converter block, such that the output voltage (VOUT) of the step-down power circuit of the DC-DC converter block is bounded by the first and second power supply voltages (VDD1, VDD2).

3. The DC-DC converter block according to claim 1, wherein the step-down power circuit is of synchronous type and has a first HEMT depletion-mode power transistor (T3) and a second HEMT depletion-mode power transistor (T6), the conduction input terminal of the first HEMT depletion-mode power transistor (T3) being connected to the first power supply voltage (VDD1), the conduction output terminal of the second HEMT depletion-mode power transistor (T6) being connected to the second power supply voltage (VDD2), the output (OUT) of the step-down power circuit being connected to the conduction output terminal of the first HEMT depletion-mode power transistor (T3) and to the conduction input terminal of the second HEMI depletion-mode power transistor (T6), and the gates of the first (T3) and second (T6) HEMT depletion-mode power transistors being connected to the gate driving circuit of the DC-DC converter block, such that the output voltage (VOUT) of the step-down power circuit of the DC-DC converter block is bounded by the first and second power supply voltages (VDD1, VDD2).

4. The DC-DC converter block according to claim 1, wherein the DC-DC converter block further comprises power supply decoupling capacitors (C1, C2) respectively arranged in parallel to the first and second power supply voltages (VDD1, VDD2).

5. The DC-DC converter block according to claim 1, wherein the gate driving circuit has, for each gate of HEMT depletion-mode transistor (T3; T6) of the step-down power circuit to be driven, a first HEMT depletion-mode drive transistor (T1; T4), a second HEMT depletion-mode drive transistor (T2; T5), first, second and third resistors (R1, R2, R3; R4, R5, R6), a Schottky diode (D2; D3) and an auxiliary power supply voltage (VAUX1; VAUX2), the source of the first HEMT depletion-mode drive transistor (T1; T4) being connected to the ground, the drain of the first HEMT depletion-mode drive transistor (T1; T4) being connected to one of the terminals of the first resistor (R1; R4) and to one of the terminals of the second resistor (R2; R5), the gate of the first HEMT depletion-mode drive transistor (T1; T4) being connected to a corresponding input (VIN1; VIN2) of the gate driving circuit, the gate of the second HEMT depletion-mode drive transistor (T2; T5) being connected to the other of the terminals of the first resistor (R1; R4), the source of the second HEMT depletion-mode drive transistor (T2; T5) being connected to the other of the terminals of the second resistor (R2; R5), to the cathode of the Schottky diode (D2; D3) and to one of the terminals of the third resistor (R3; R6), the anode of the Schottky diode (D2; D3) being connected to the auxiliary power supply voltage (VAUX1; VAUX2), the other of the terminals of the third resistor (R3; R6) being connected to the gate of the HEMT depletion-mode transistor (T3; T6) of the corresponding to-be-driven step-down power circuit, the drain of the second HEMT depletion-mode drive transistor (T2; T5) being connected to the first power supply voltage (VDD1) if the first power supply voltage (VDD1) is connected to the conduction input terminal of the HEMT depletion-mode transistor (T3; T6) of the corresponding to-be-driven step-down power circuit or being connected to the second power supply voltage (VDD2) if the second power supply voltage (VDD2) is connected to the conduction output terminal of the HEMT depletion-mode transistor (T3; T6) of the corresponding to-be-driven step-down power circuit, the auxiliary power supply voltage (VAUX1; VAUX2) being greater than the pinch-off voltage of the second HEMT depletion-mode drive transistor (T2; T5), and the second power supply voltage (VDD2) being higher than the auxiliary power supply voltage (VAUX1; VAUX2) plus the pinch-off voltage of the HEMT depletion-mode transistor (T3; T6) of the corresponding to-be-driven step-down power circuit.

6. The DC-DC converter block according to claim 5, wherein each input voltage (VIN1; VIN2) at a corresponding input of the gate driving circuit is negative and between 0V and −Vp, Vp being the pinch-off voltage of the HEMT depletion-mode drive transistor whose gate is connected to said corresponding input of the gate driving circuit, said input voltage (VIN1; VIN2) being output by an interface circuit connected to a sigma-delta or PWM (pulse-width modulation) control digital circuit.

7. The DC-DC converter block according to claim 5, wherein, when the step-down power circuit is of synchronous type, both input voltages (VIN1; VIN2) of the gate driving circuit are complementary.

8. The DC-DC converter block according to claim 1, wherein the sizes of gate of the HEMT depletion-mode transistors (T1, T2, T4, T5) of the gate driving circuit are smaller than the sizes of gate of the at least one HEMT depletion-mode transistor (T3, T6) of the step-down power circuit.

9. The DC-DC converter block according to claim 1, wherein all the components of the DC-DC converter block are discrete components mounted on a printed circuit board or connected to a printed circuit board by link wires.

10. The DC-DC converter block according to claim 1, wherein all the components of the DC-DC converter block are monolithically integrated on an integrated circuit.

11. The DC-DC converter block according to claim 1, wherein the at least one HEMT depletion-mode transistor (T3, T6) of the step-down power circuit and the HEMT depletion-mode transistors (T1,T2; T4,T5) of the gate driving circuit are made of any one of gallium nitride (GaN), gallium arsenide (GaAs), and a semiconductor material with materials of the group III-V.

12. The DC-DC converter block according to claim 2, wherein the Schottky power diode (D1) is made of Si, SiC, GaAs, GaN, and a semiconductor material with materials of the group III-V.

13. A high-power and high-frequency DC-DC converter for the envelope tracking technique, wherein the high-power and high-frequency DC-DC converter for the envelope tracking technique comprises a high-power and high-frequency DC-DC converter block according to claim 1 and an output filter connected to the output of the step-down power circuit of the high-power and high-frequency DC-DC converter block, the filter comprising capacitors and inductors, the output of the output filter constituting the output of the high-power and high-frequency DC-DC converter for the envelope tracking technique.

14. A high-power and high-frequency multi-phase DC-DC converter for the envelope tracking technique, wherein the high-power and high-frequency multi-phase DC-DC converter for the envelope tracking technique comprises at least two high-power and high-frequency DC-DC converters for the envelope tracking technique according to claim 13 mounted in parallel and supplied by the same power supply voltages (VDD1) and (VDD2).

15. A system for the envelope tracking technique comprising a high-power and high-frequency DC-DC converter for the envelope tracking technique according to claim 13, a radio frequency (RF) power amplifier and an envelope tracking processing digital circuit, the envelope tracking processing digital circuit controlling the high-power and high-frequency DC-DC converter for the envelope tracking technique and the RF power amplifier, and the output of the high-power and high-frequency DC-DC converter for the envelope tracking technique being connected to a power supply voltage input of the RF power amplifier.

16. A system for the envelope tracking technique comprising a high-power and high-frequency multi-phase DC-DC converter for the envelope tracking technique according to claim 14, a radio frequency (RF) power amplifier and an envelope tracking processing digital circuit, the envelope tracking processing digital circuit controlling the high-power and high-frequency multi-phase DC-DC converter for the envelope tracking technique and the RF power amplifier, and the output of the high-power and high-frequency multi-phase DC-DC converter for the envelope tracking technique being connected to a power supply voltage input of the RF power amplifier.

17. The DC-DC converter block according to claim 5, wherein the Schottky diodes (D2; D3) are made of Si, SiC, GaAs, GaN or any other semiconductor material with materials of the group III-V.

* * * * *